United States Patent
Nakano

(10) Patent No.: US 12,379,232 B2
(45) Date of Patent: Aug. 5, 2025

(54) DETECTING DEVICE

(71) Applicant: Japan Display Inc., Tokyo (JP)

(72) Inventor: Fumihoru Nakano, Tokyo (JP)

(73) Assignee: Japan Display Inc., Tokyo (JP)

( * ) Notice: Subject to any disclaimer, the term of this patent is extended or adjusted under 35 U.S.C. 154(b) by 233 days.

(21) Appl. No.: 18/203,825

(22) Filed: May 31, 2023

(65) Prior Publication Data

US 2023/0392960 A1 Dec. 7, 2023

(30) Foreign Application Priority Data

Jun. 1, 2022 (JP) .................. 2022-089907

(51) Int. Cl.
| | | |
|---|---|---|
| *G01D 5/24* | (2006.01) | |
| *G01R 27/26* | (2006.01) | |
| *G06F 3/041* | (2006.01) | |
| *G06F 3/044* | (2006.01) | |
| *H03K 17/96* | (2006.01) | |
| *G06F 3/043* | (2006.01) | |

(52) U.S. Cl.
CPC ........... *G01D 5/24* (2013.01); *G06F 3/04166* (2019.05); *H03K 17/9622* (2013.01); *G01R 27/2605* (2013.01); *G06F 3/0433* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; G06F 3/00; G06F 3/01; G06F 3/03; G06F 3/041; G06F 3/0416; G06F 3/04166; G06F 3/044; G06F 3/0443; G06F 2203/00; G06F 2203/041; G06F 2203/04101; H03K 17/00; H03K 17/94; H03K 17/96; H03K 17/9622; H03K 2217/00; H03K 2217/94; H03K 2217/96; H03K 2217/9607; H03K 2217/960705
USPC ......................................... 324/600, 649, 658
See application file for complete search history.

(56) References Cited

U.S. PATENT DOCUMENTS

| | | | | |
|---|---|---|---|---|
| 6,456,198 B1 * | 9/2002 | Kato | .................. | G08B 13/122 |
| | | | | 256/48 |
| 8,720,279 B2 * | 5/2014 | Ogawa | .................. | E05F 15/46 |
| | | | | 702/65 |
| 9,778,806 B2 * | 10/2017 | Tanaka | .............. | G06F 3/041662 |
| 2013/0342498 A1 | 12/2013 | Kim et al. | | |
| 2014/0049486 A1 | 2/2014 | Kim et al. | | |
| 2014/0049508 A1 | 2/2014 | Kim et al. | | |
| 2014/0160056 A1 * | 6/2014 | Mahalingam | ......... | G06F 3/0445 |
| | | | | 345/174 |

FOREIGN PATENT DOCUMENTS

| | | | | | |
|---|---|---|---|---|---|
| CN | 107533128 A | * | 1/2018 | ............... | G01C 3/06 |
| CN | 107037909 B | * | 6/2020 | ......... | G02F 1/13338 |
| CN | 115942915 A | * | 4/2023 | ......... | A61B 18/1492 |
| WO | WO-2010119329 A2 | * | 10/2010 | ........... | G06T 7/2006 |

* cited by examiner

*Primary Examiner* — Hoai-An D. Nguyen
(74) *Attorney, Agent, or Firm* — K&L Gates LLP

(57) ABSTRACT

A detecting device includes a sensor region having a detection region, a plurality of electrodes provided to the detection region, and a detection circuit configured to detect an object to be detected on the detection region frame by frame based on a detected value of each of the electrodes. Length of one frame period for detecting the object to be detected on the detection region differs depending on a relative distance between the sensor region and the object to be detected.

7 Claims, 14 Drawing Sheets

DETECTING DEVICE

CROSS-REFERENCE TO RELATED APPLICATION

This application claims the benefit of priority from Japanese Patent Application No. 2022-089907 filed on Jun. 1, 2022, the entire contents of which are incorporated herein by reference.

BACKGROUND

1. Technical Field

The present invention relates to a detecting device.

2. Description of the Related Art

Recently known are detection systems, what are called touch panels, in which a detecting device capable of detecting an external proximity object is mounted on or integrated with a display device, such as a liquid crystal display device (refer to the specification of US Patent Application Laid-open Publication No. 2014/0049486, the specification of US Patent Application Laid-open Publication No. 2013/0342498, and the specification of US Patent Application Laid-open Publication No. 2014/0049508, for example). In such detection systems, not only a touch detection function but also a hover detection function has been attracting attention. The touch detection function is a function to detect contact of an object to be detected, such as an operator's finger, with a detection surface. The hover detection function is a function to detect a proximity state, a gesture, and the like of the finger not in contact with the detection surface in a space on a detection region.

There is a configuration that detects the spatial coordinates of the position where the object to be detected is present on the detection region by detecting the capacitance generated in each of a plurality of electrodes provided in the detection region. In this configuration, it is necessary to increase the size of each electrode to enhance the sensitivity and expand the range detectable by a detection circuit compared with a configuration that detects the plane coordinates of a touch detection position.

An object of the present invention is to provide a detecting device that can expand the range in which an object to be detected on a detection region can be detected with high accuracy.

SUMMARY

A detecting device according to an embodiment of the present disclosure includes a sensor region having a detection region, a plurality of electrodes provided to the detection region, and a detection circuit configured to detect an object to be detected on the detection region frame by frame based on a detected value of each of the electrodes. Length of one frame period for detecting the object to be detected on the detection region differs depending on a relative distance between the sensor region and the object to be detected.

DETAILED DESCRIPTION

Figure 1:
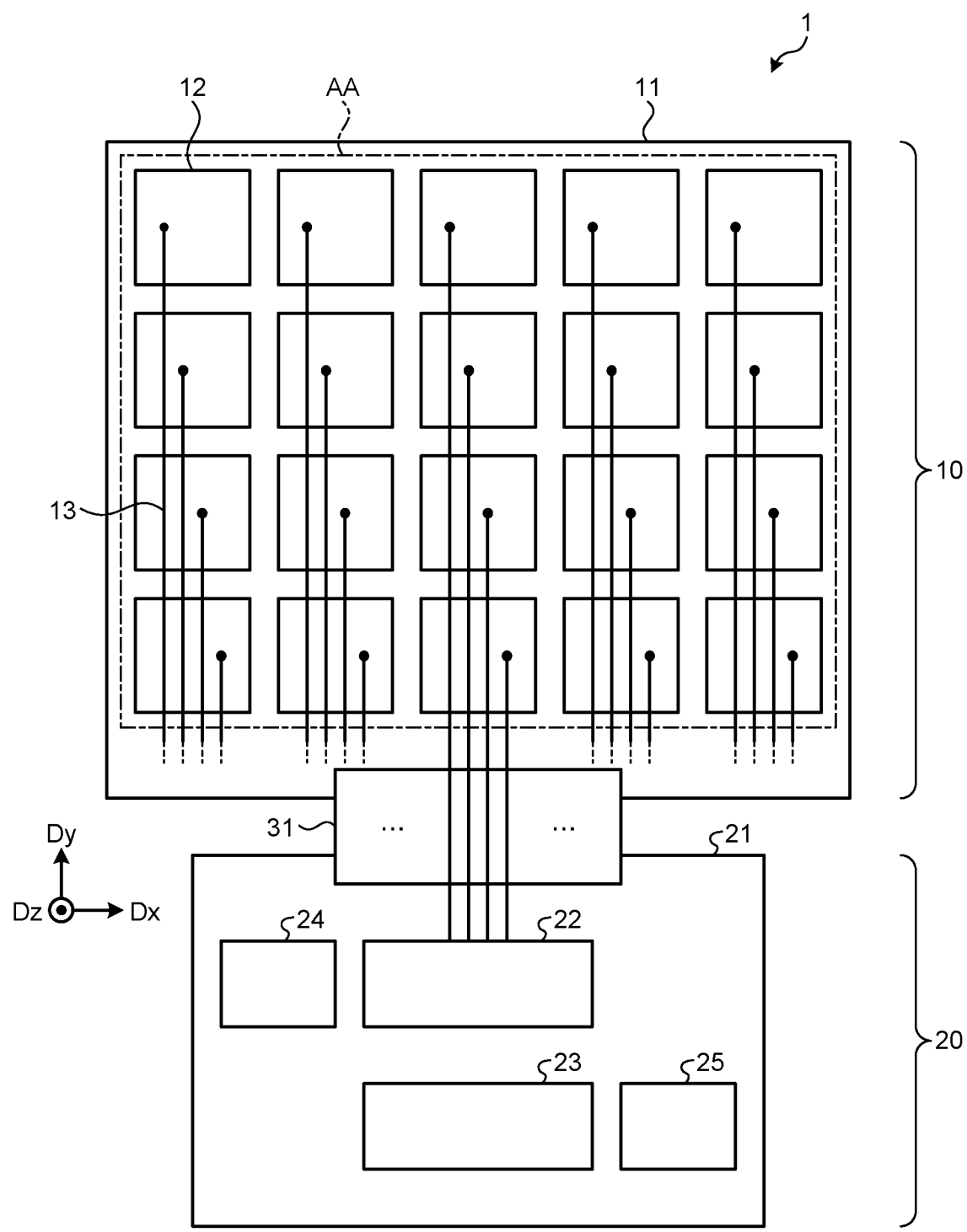
FIG. 1 is a plan view of a schematic configuration of a detecting device according to an embodiment.

Exemplary aspects (embodiments) to embody the present invention are described below in greater detail with reference to the accompanying drawings. The contents described in the embodiments are not intended to limit the present invention. Components described below include components easily conceivable by those skilled in the art and components substantially identical therewith. Furthermore, the components described below may be appropriately combined. What is disclosed herein is given by way of example only, and appropriate modifications made without departing from the spirit of the present invention and easily conceivable by those skilled in the art naturally fall within the scope of the present invention. To simplify the explanation, the drawings may possibly illustrate the width, the thickness, the shape, and other elements of each unit more schematically than those in the actual aspect. These elements, however, are given by way of example only and are not intended to limit interpretation of the present invention. In the present specification and the drawings, components similar to those previously described with reference to previous drawings are denoted by like reference numerals, and detailed explanation thereof may be appropriately omitted.

FIG. 1 is a plan view of a schematic configuration of a detecting device according to an embodiment. As illustrated in FIG. 1, a detecting device 1 includes a sensor region 10 and a control circuit 20.

The sensor region 10 includes a sensor substrate 11, a plurality of electrodes 12, and wiring 13. The electrodes 12 are provided in a detection region AA of the sensor substrate 11. The wiring 13 extends from each of the electrodes 12. The control circuit 20 includes a control substrate 21, an analog front end (AFE) circuit 22, a processing circuit 23, a power circuit 24, and an interface circuit 25.

The detection region AA of the sensor substrate 11 is a region provided with the electrodes 12 arrayed in a matrix (row-column configuration) in a Dx direction (first direction) and a Dy direction (second direction). The sensor substrate 11 is a glass substrate or translucent flexible printed circuits (FPC), for example.

In the present disclosure, the Dx direction (first direction) and the Dy direction (second direction) are orthogonal to each other in the detection region AA of the sensor substrate 11. In the present disclosure, the direction orthogonal to the Dx direction (first direction) and the Dy direction (second direction) is a Dz direction (third direction).

In the example illustrated in FIG. 1, five electrodes 12 are arrayed in the Dx direction, and four electrodes 12 are arrayed in the Dy direction, that is, 5×4 (=20) electrodes 12 are provided. The number of electrodes 12 provided in the detection region AA of the sensor substrate 11 is not limited thereto.

The control substrate 21 is electrically coupled to the sensor substrate 11 via a wiring substrate 31. The wiring substrate 31 is flexible printed circuits, for example. Each electrode 12 in the sensor region 10 is coupled to the AFE circuit 22 of the control circuit 20 via the wiring substrate 31.

The control substrate 21 is provided with the AFE circuit 22, the processing circuit 23, the power circuit 24, and the interface circuit 25. The control substrate 21 is a rigid substrate, for example.

The AFE circuit 22 generates a detected value of each electrode 12 based on a detection signal of the electrode 12 output from the sensor substrate 11. The AFE circuit 22 is an analog front end IC, for example.

The processing circuit 23 generates the spatial coordinates indicating the position where an object to be detected (e.g., an operator's finger) is present on the detection region AA based on the detected value of each electrode 12 output from the AFE circuit 22. The processing circuit 23 may be a programmable logic device (PLD), such as a field programmable gate array (FPGA), or a micro control unit (MCU), for example.

The power circuit 24 is a circuit that supplies electric power to the AFE circuit 22 and the processing circuit 23.

The interface circuit 25 is a USB controller IC, for example, and is a circuit that controls communications between the processing circuit 23 and a host controller (not illustrated) of a host device on which the detection system is mounted.

Figure 2:
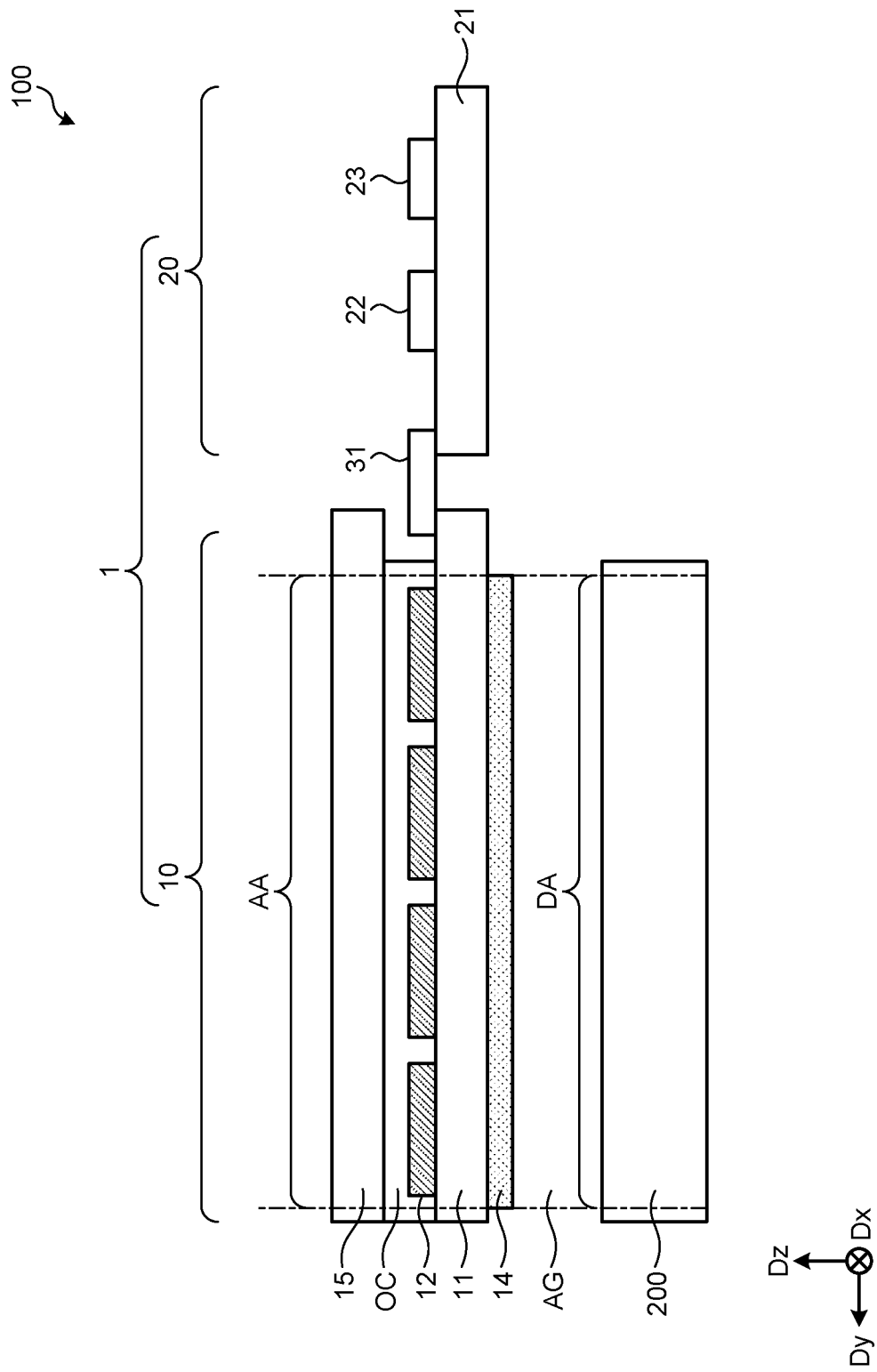
FIG. 2 is a schematic of a schematic sectional configuration of a detection system in which the detecting device according to the embodiment is used.

FIG. 2 is a schematic of a schematic sectional configuration of the detection system in which the detecting device according to the embodiment is used.

A detection system 100 includes the detecting device 1 and a display panel 200. The display panel 200 is disposed facing the sensor region 10 of the detecting device 1 with an air gap AG interposed therebetween. The sensor region 10 of the detecting device 1 is disposed such that the detection region AA of the sensor region 10 and a display region DA of the display panel 200 overlap in the Dz direction (third direction) in plan view. The display panel 200 is a liquid crystal display (LCD), for example. The display panel 200 may be an organic EL display (organic light-emitting diode (OLED)) or an inorganic EL display (a micro LED or a mini LED), for example.

The sensor region 10 includes the sensor substrate 11, the electrodes 12, a shield 14, and a cover glass 15. The sensor region 10 is composed of the shield 14, the sensor substrate 11, the electrodes 12, and the cover glass 15 stacked in this order on the display panel 200. In the following description, the surface of the cover glass 15 provided on the top layer is also referred to as a "detection surface".

The shield 14 is provided on a first surface of the sensor substrate 11 facing the display panel 200. The electrodes 12 are provided on a second surface of the sensor substrate 11 opposite to the first surface. The cover glass 15 is provided on the side of the second surface of the sensor substrate 11 with an adhesive layer OC interposed therebetween. The adhesive layer OC is preferably made of translucent adhesive. The adhesive layer OC may be made of a translucent double-sided adhesive film, such as optical clear adhesive (OCA).

Figure 3:
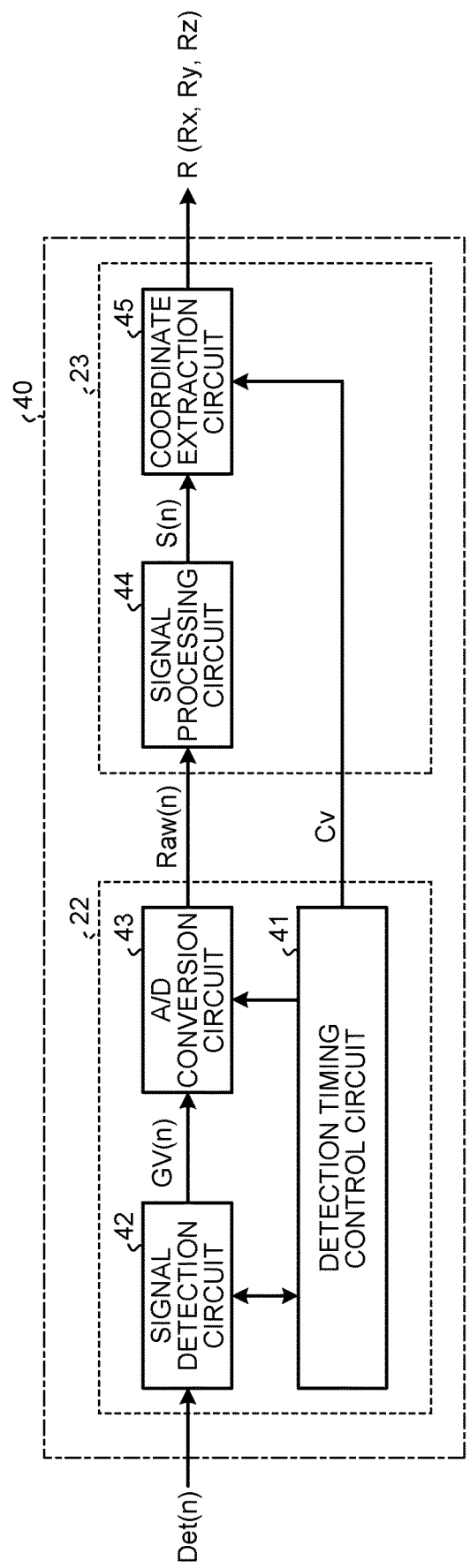
FIG. 3 is a block diagram of an exemplary configuration of a detection circuit of the detecting device according to the embodiment.

FIG. 3 is a block diagram of an exemplary configuration of a detection circuit of the detecting device according to the embodiment.

As illustrated in FIG. 3, a detection circuit 40 includes a detection timing control circuit 41, a signal detection circuit 42, an A/D conversion circuit 43, a signal processing circuit 44, and a coordinate extraction circuit 45. In the present disclosure, the detection timing control circuit 41, the signal detection circuit 42, and the A/D conversion circuit 43 are included in the AFE circuit 22. The signal processing circuit 44 and the coordinate extraction circuit 45 are included in the processing circuit 23.

The detection timing control circuit 41 is a component that controls a detection operation timing in the signal detection circuit 42 and the A/D conversion circuit 43. A specific operation of the detection timing control circuit 41 according to the present disclosure will be described later.

The signal detection circuit 42 generates an output value GV(n) of each electrode 12 based on a detection signal Det(n) (n is a natural number from 1 to N, where N is the number of electrodes in the detection region AA) of each electrode 12 output from the sensor substrate 11. The A/D conversion circuit 43 samples the output value GV(n) of the signal detection circuit 42 and converts it into a discrete detected value Raw(n).

The signal processing circuit 44 performs predetermined signal processing on the detected value Raw(n) of each electrode 12 to calculate a signal value S(n) of each electrode 12. A specific example of processing performed by the signal processing circuit 44 will be described later.

The coordinate extraction circuit 45 extracts the spatial coordinates of the position where the object to be detected is present based on the signal value S(n) of each electrode 12 output from the signal processing circuit 44.

Figure 4A:
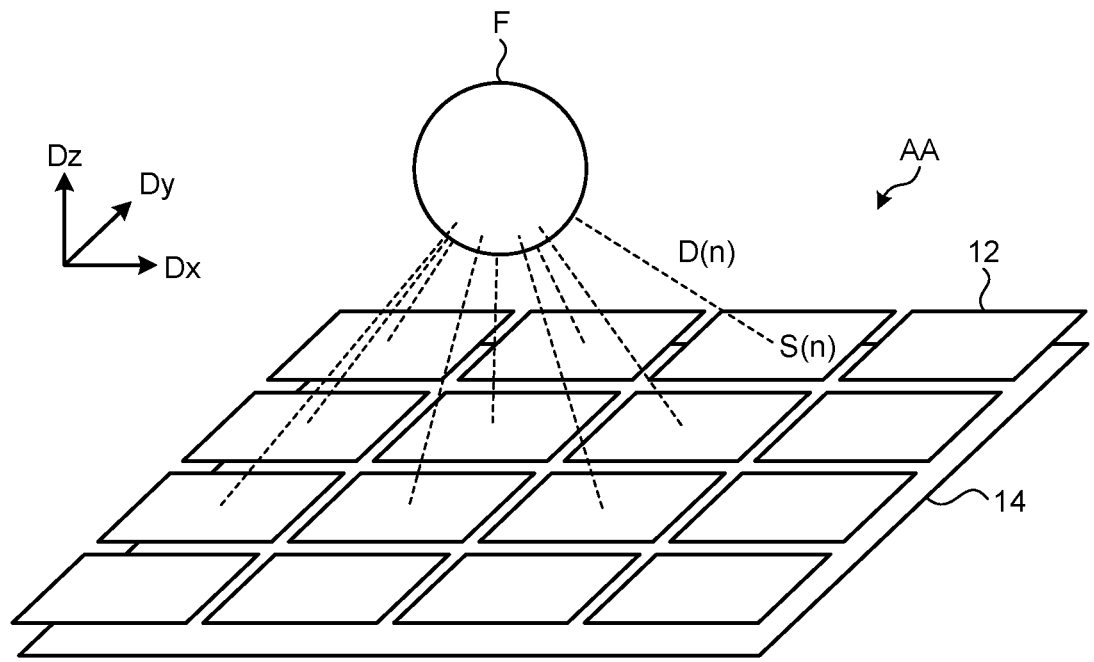
FIG. 4A is a schematic of the positional relation between the position of an object to be detected in a space on a detection region and each electrode.
Figure 4B:
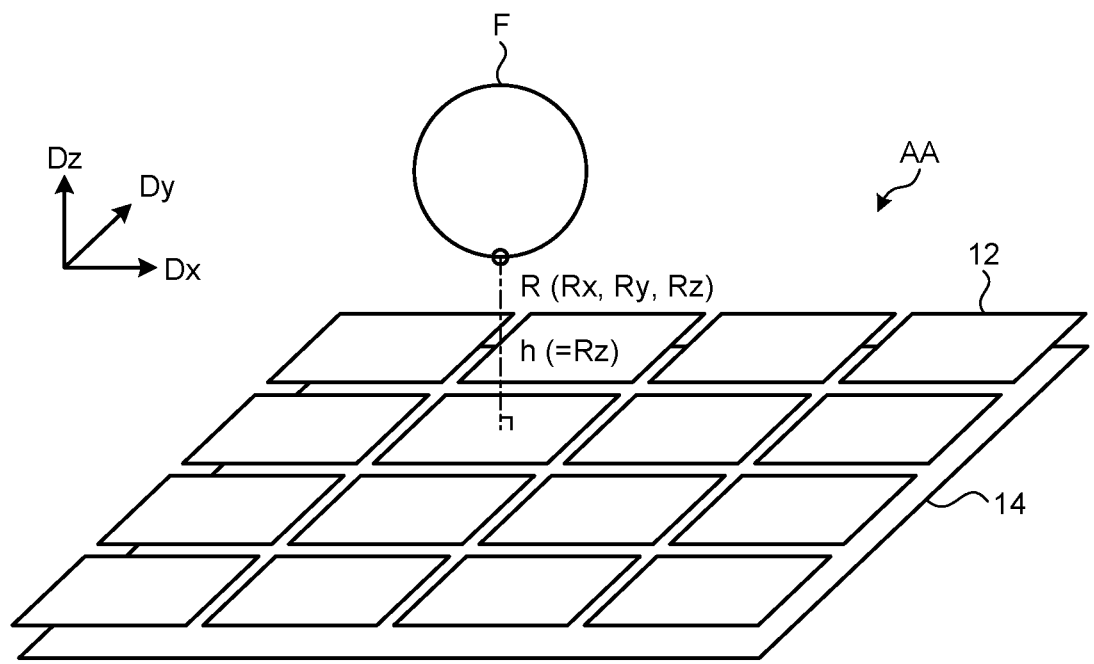
FIG. 4B is a schematic of the spatial coordinates of the object to be detected in the space on the detection region.

FIG. 4A is a schematic of the positional relation between the position of the object to be detected in a space on the detection region and each electrode. FIG. 4B is a schematic of the spatial coordinates of the object to be detected in the space on the detection region. FIGS. 4A and 4B illustrate an example where an object to be detected F is present in the space on the detection region AA.

As illustrated in FIG. 4A, each electrode 12 in the detection region AA has capacitance generated corresponding to a distance D(n) between the object to be detected F present in the space on the detection region AA and the electrode 12. The signal value S(n) corresponding to the capacitance is acquired.

The processing circuit 23 extracts spatial coordinates R (Rx,Ry,Rz) indicating the position of the object to be detected F in the space on the detection region AA illustrated in FIG. 4B using the generated signal value S(n) of each electrode 12.

In the present disclosure, the spatial coordinates R (Rx, Ry,Rz) include first data Rx indicating the position in the Dx direction (first direction) on the detection region AA, second data Ry indicating the position in the Dy direction (second direction) on the detection region AA, and third data Rz indicating the position in the Dz direction (third direction) orthogonal to the Dx direction (first direction) and the Dy direction (second direction).

In the present disclosure, the spatial coordinates R (Rx, Ry,Rz) indicate the position of the object to be detected F in the space on the detection surface by regarding the surface of the cover glass 15 as the detection surface.

As described above, the detecting device 1 according to the present disclosure is configured to detect the spatial coordinates of the position where the object to be detected F is present on the detection region AA by detecting the capacitance generated in each electrode 12. To detect the object to be detected F present at a position away from the detection region AA in the Dz direction, it is necessary to increase the size of each electrode 12 and enhance sensitivity compared with a configuration that detects the plane coordinates of the contact position of the object to be detected F with the detection surface. In the present disclosure, the size of each electrode 12 is assumed to be approximately 20×20 [mm$^2$] to 50×50 [mm$^2$], for example. In other words, the pitch between the electrodes 12 in the Dx and Dy directions is assumed to be 20 [mm] to 50 [mm], for example.

Figure 5:
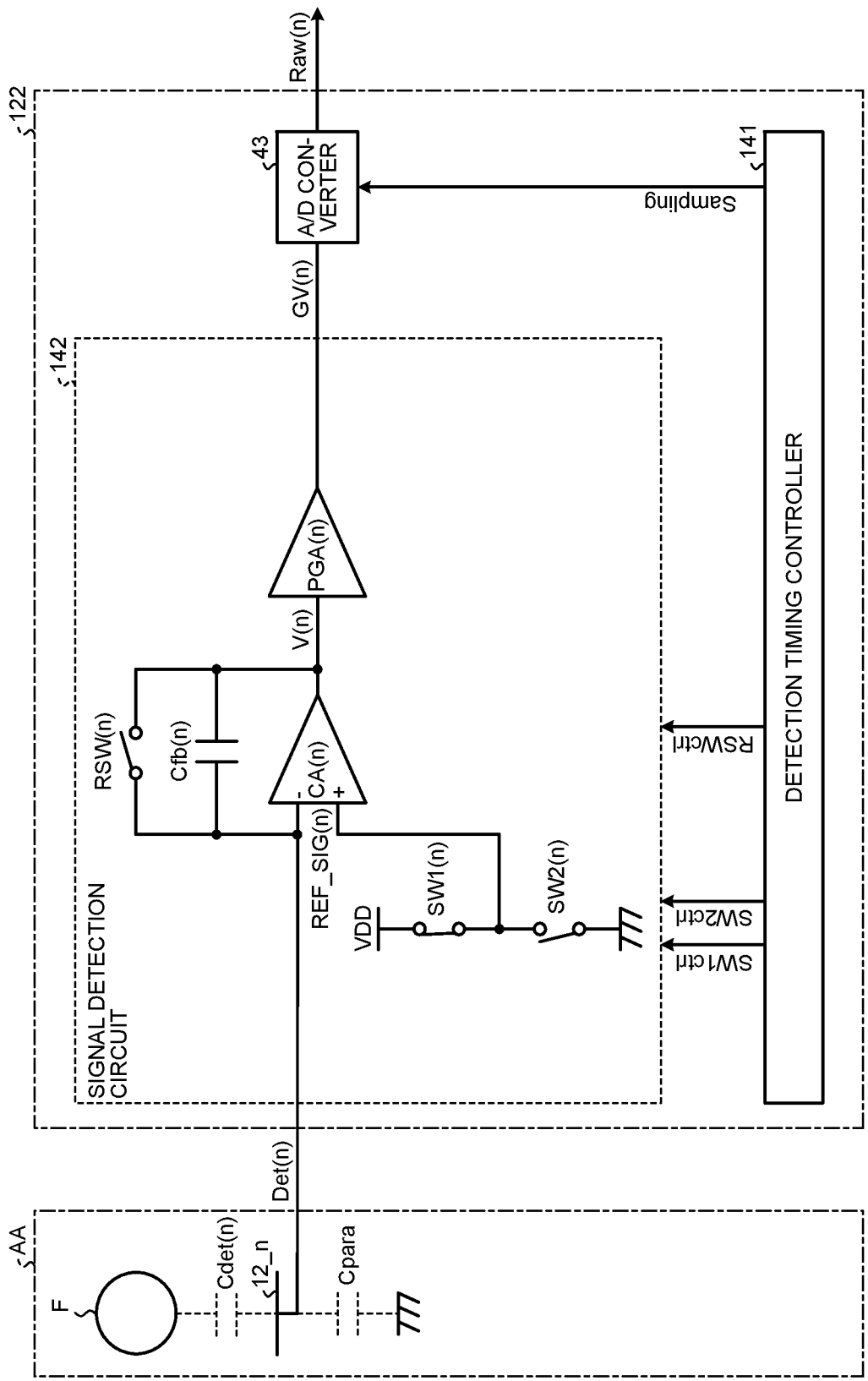
FIG. 5 is a diagram of an example of a specific circuit configuration of an AFE circuit according to a comparative example.

FIG. 5 is a diagram of an example of a specific circuit configuration of the AFE circuit according to a comparative example. FIG. 5 illustrates a comparative example corresponding to the configuration according to the embodiment, which will be described later.

In the comparative example illustrated in FIG. 5, a signal detection circuit 142 of an AFE circuit 122 includes a differential amplification circuit CA(n) and an amplification circuit PGA(n) as main components.

A first switch circuit SW1 and a second switch circuit SW2 are coupled to a non-inverting input terminal of the differential amplification circuit CA(n), and a first reference potential VDD and a second reference potential GND are selectively applied thereto. The first switch circuit SW1 is turned on and off by a first switch control signal SW1ctrl output from a detection timing control circuit 141. The second switch circuit SW2 is turned on and off by a second switch control signal SW2ctrl output from the detection timing control circuit 141.

Specifically, when the first switch circuit SW1 is turned on, and the second switch circuit SW2 is turned off, the first reference potential VDD is applied to the non-inverting input terminal of the differential amplification circuit CA(n). When the first switch circuit SW1 is turned off, and the second switch circuit SW2 is turned on, the second reference potential GND is applied to the non-inverting input terminal of the differential amplification circuit CA(n). By turning on and off the first switch circuit SW1 and the second switch circuit SW2, the non-inverting input terminal of the differential amplification circuit CA(n) receives a reference signal REF_SIG in a square wave form having the first reference potential VDD as a high potential (hereinafter also referred to as an "H" potential) and the second reference potential GND as a low potential (hereinafter also referred to as an "L" potential). While the second reference potential is the GND potential, it is not limited thereto. The second reference potential simply needs to be lower than the first reference potential.

An inverting input terminal serving as the other terminal of the differential amplification circuit CA(n) is coupled to an electrode 12_n provided in the detection region AA. Negative feedback capacitor Cfb and a reset switch circuit RSW that resets the negative feedback capacitor Cfb are provided between the inverting input terminal and an output terminal of the differential amplification circuit CA(n). The differential amplification circuit CA(n) functions as an integration circuit with the configuration described above. The reset switch circuit RSW is turned on and off by a reset switch control signal RSWctrl output from the detection timing control circuit 141.

The amplification circuit PGA(n) amplifies an output value V(n) of the differential amplification circuit CA(n). When the gain of the amplification circuit PGA(n) is G, the output value of the signal detection circuit 142 can be expressed as GV(n) obtained by multiplying the output value V(n) of the differential amplification circuit CA(n) by the gain G.

Figure 6:
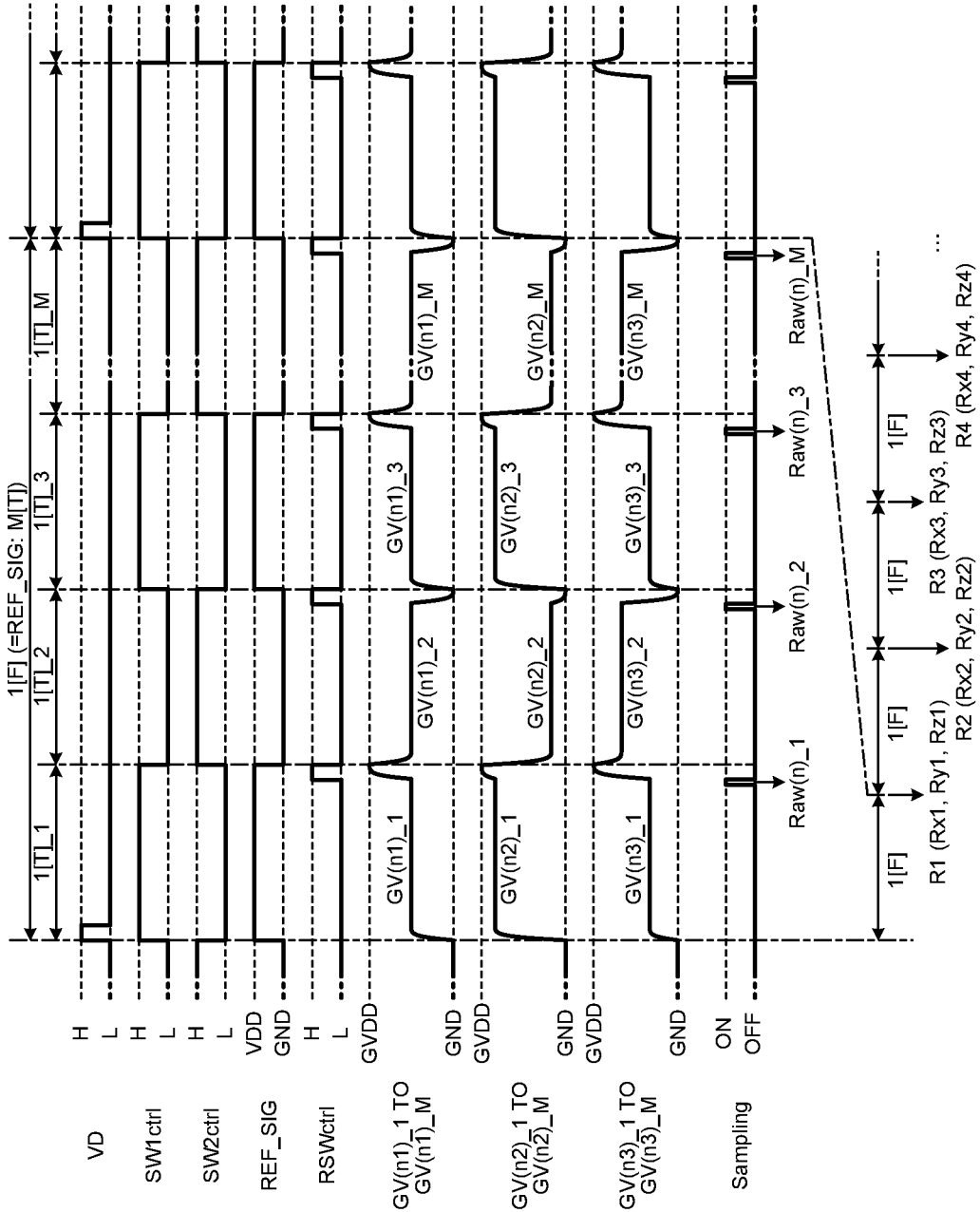
FIG. 6 is a timing chart of an example of operation according to the comparative example illustrated in FIG. 5.

The following describes the operation according to the comparative example illustrated in FIG. 5 with reference to FIG. 6. FIG. 6 is a timing chart of an example of the operation according to the comparative example illustrated in FIG. 5. FIG. 6 illustrates an example of detecting the object to be detected F according to the comparative example illustrated in FIG. 5 by defining M sampling periods (M is a natural number equal to or larger than 1) as one frame (1[F]=M[T]).

In the comparative example illustrated in FIG. 5, the negative feedback capacitor Cfb of the differential amplification circuit CA(n) is reset in a sampling period 1[T]_m (m is a natural number of 1 to M).

Specifically, the electrode 12_n is charged with an electric charge corresponding to the distance D between the object to be detected F and the electrode 12 in a high period (hereinafter also referred to as an "H" period) and a low period (hereinafter also referred to as an "L" period) of the reference signal REF_SIG after resetting the negative feedback capacitor Cfb of the differential amplification circuit CA(n). At this time, the detection signal Det(n) corresponding to the electric charge with which the electrode 12_n is charged is input to the "−" terminal of the differential amplification circuit CA(n). Accordingly, the negative feedback capacitor Cfb of the differential amplification circuit CA(n) is charged, and the signal detection circuit 142 outputs GV(n)_1, GV(n)_2, GV(n)_3, . . . , and GV(n)_M obtained by multiplying the output value V(n) of the differential amplification circuit CA(n) by the gain G of the amplification circuit PGA(n).

FIG. 6 illustrates output values GV(n1)_1 to GV(n1)_M of the signal detection circuit 142 at an electrode 12_n1, output values GV(n2)_1 to GV(n2)_M of the signal detection circuit 142 at an electrode 12_n2, and output values GV(n3)_1 to GV(n3)_M of the signal detection circuit 142 at an electrode 12_n3, for example. In FIG. 6, when the distance of the electrode 12_n1 from the object to be detected F is D(n1), the distance of the electrode 12_n2 from the object to be detected F is D(n2), and the distance of the electrode 12_n3 from the object to be detected F is D(n3), D(n2)<D(n1)<D(n3) is satisfied.

The A/D conversion circuit 43 performs sampling on the output values GV(n)_1, GV(n)_2, GV(n)_3, . . . , and GV(n)_M of the signal detection circuit 142 in the sampling period 1[T]_m and outputs Raw(n)_1, Raw(n)_2, Raw(n)_3, . . . , and Raw(n)_M.

In the example illustrated in FIG. 6, the detecting device according to the comparative example detects whether the object to be detected F is present on the detection region AA in each frame and outputs spatial coordinates Rp (Rxp,Ryp, Rzp) (p is a natural number) of the position of the object to be detected F on the detection region AA.

Specifically, in the example illustrated in FIG. 6, the signal processing circuit 44 calculates signal values S(n)_odd and signal values S(n) even by applying the following Expressions (1) and (2) to detected values Raw(n)_odd (Raw(n)_1, Raw(n)_3, . . . , and Raw(n)_M−1) acquired in the "H" period of the reference signal REF_SIG and detected values Raw(n)_even (Raw(n) 2, Raw(n) 4, and Raw(n) M) acquired in the "L" period of the reference signal REF_SIG, respectively. In Expression (2), S max is the maximum gradation of the digital signal obtained after the A/D conversion circuit 43.

$$S(n)\_odd = Raw(n)\_odd \tag{1}$$

$$S(n)\_even = S\_max - Raw(n)\_even \tag{2}$$

The signal processing circuit 44 performs averaging on the signal values S(n)_1, S(n)_2, . . . , and S(n)_M in one frame.

Figure 7:
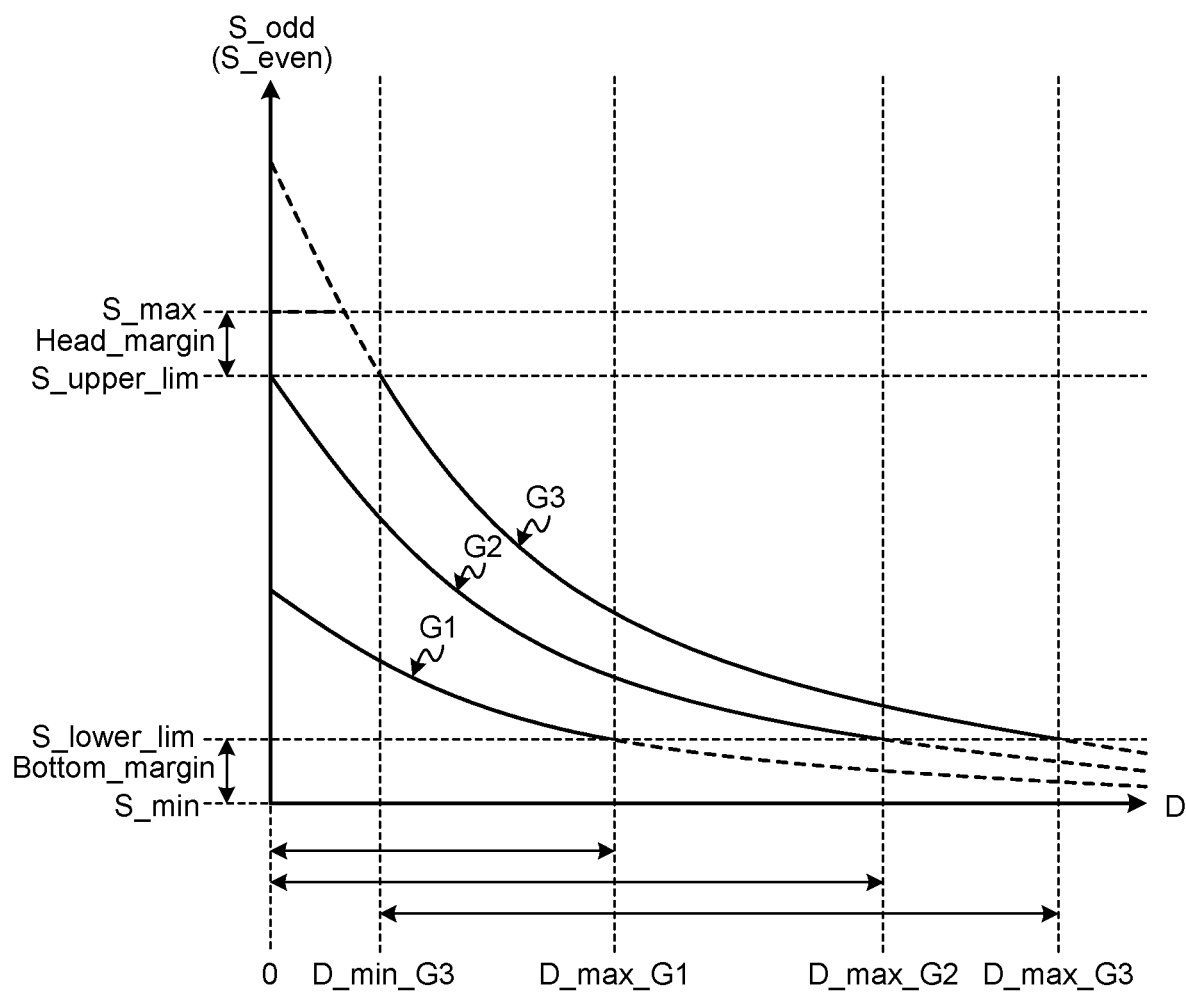
FIG. 7 is a diagram of the relation between a signal value and the distance between the object to be detected and the electrode.

FIG. 7 is a diagram of the relation between the signal value and the distance between the object to be detected and the electrode. In FIG. 7, the horizontal axis indicates the distance D between the object to be detected F and the electrode 12, and the vertical axis indicates the signal value S_odd (or the signal value S_even).

The signal value S_odd (or the signal value S_even) corresponds to the output value GV of the signal detection circuit 142 corresponding to the distance D between the object to be detected F and the electrode 12. The minimum gradation S_min of the signal value S_odd (or the signal value S_even) corresponds to a data value of "0" of the digital signal obtained after the A/D conversion circuit 43. The maximum gradation S max of the digital signal obtained after the A/D conversion circuit 43 corresponds to a data value of "255" when the resolution in the processing after the A/D conversion circuit 43 is 8 bits, for example. FIG. 7 illustrates an example where the gain of the amplification circuit PGA is G1, G2, and G3 (G1<G2<G3).

As illustrated in FIG. 7, the ratio of decrease in the signal value S_odd (or the signal value S_even) decreases as the distance D between the object to be detected F and the electrode 12 increases. In other words, the ratio of change in the signal value S_odd (or the signal value S_even) decreases as the distance D between the object to be detected F and the electrode 12 increases. In a region where the distance D between the object to be detected F and the electrode 12 is relatively large, parasitic capacitance Cpara generated between the electrode 12 and a shield potential (e.g., GND potential) has a large effect on capacitance Cdet generated at the electrode 12 corresponding to the distance D between the object to be detected F and the electrode 12. The effect of quantization error of the signal value S_odd (or the signal value S_even) increases corresponding to a change in the distance D. For this reason, a margin (Bottom margin) is set for the minimum gradation S_min of the signal value S_odd (or the signal value S_even), and S_lower_lim is set as the lower limit gradation that can be taken as the signal value S_odd (or the signal value S_even).

As illustrated in FIG. 7, the ratio of increase in the signal value S_odd (or the signal value S_even) exponentially increases as the distance D between the object to be detected F and the electrode 12 decreases. In other words, the ratio of change in the signal value S_odd (or the signal value S_even) increases as the distance D between the object to be detected F and the electrode 12 decreases. In particular, the size of each electrode 12 is large (e.g., approximately 20×50 [mm$^2$] to 50×50 [mm$^2$]) in the detecting device 1 according to the present disclosure. When the distance D between the object to be detected F and the electrode 12 is relatively small (e.g., when the object to be detected F is present at a position in proximity to or in contact with the detection surface), the signal value S_odd (or the signal value S_even) may possibly overflow. For this reason, a margin (Head margin) is set for the maximum gradation S max of the signal value S_odd (or the signal value S_even), and S_upper_lim is set as the upper limit gradation that can be taken as the signal value S_odd (or the signal value S_even).

By setting the upper and lower limits for the signal value S_odd (or the signal value S_even), the signal value S_odd (or the signal value S_even) can be obtained in a linear region in the sampling performed by the A/D conversion circuit 43 (a region where the output value linearly changes with a change in the input value of the A/D conversion circuit 43).

If the gain G of the amplification circuit PGA is increased to improve the accuracy of detecting the object to be detected F when the distance D between the object to be detected F and the electrode 12 is relatively large, that is, when the object to be detected F is present at a position away from the detection surface, the detection accuracy may possibly be reduced when the distance D between the object to be detected F and the electrode 12 is relatively small (e.g., when the object to be detected F is present at a position in proximity to or in contact with the detection surface). Specifically, when the gain of the amplification circuit PGA is set to G3, the signal value S_odd (or the signal value S_even) may possibly overflow at the electrode 12 present at a position closer than a distance D min G3 illustrated in FIG. 7 from the object to be detected F. More specifically, in the example illustrated in FIG. 6, when the distance D(n1) of the electrode 12_n1 from the object to be detected F, the distance D(n2) of the electrode 12_n2 from the object to be detected F, and the distance D(n3) of the electrode 12_n3 from the object to be detected F are relatively small, the signal value S_odd (or the signal value S_even) corresponding to the electrode 12_n2, for example, may possibly overflow. As a result, the accuracy of detecting the spatial coordinates of the object to be detected F may possibly be reduced.

If the gain G of the amplification circuit PGA is reduced to improve the accuracy of detecting the object to be detected F when the distance D between the object to be detected F and the electrode 12 is relatively small, that is, when the object to be detected F is present at a position in proximity to or in contact with the detection surface, the detection accuracy may possibly be reduced when the distance D between the object to be detected F and the electrode 12 is relatively large, that is, when the object to be detected F is present at a position away from the detection surface. Specifically, when the gain of the amplification circuit PGA is set to G1, the signal value S_odd (or the signal value S_even) corresponding to the electrode 12 provided at a position farther than a distance D max G1 illustrated in FIG.

7 from the object to be detected F is more likely to be affected by the parasitic capacitance Cpara and the quantization error. More specifically, in the example illustrated in FIG. 6, when the distance D(n1) of the electrode 12_*n*1 from the object to be detected F, the distance D(n2) of the electrode 12_*n*2 from the object to be detected F, and the distance D(n3) of the electrode 12_*n*3 from the object to be detected F are relatively large, the signal value S_odd (or the signal value S_even) corresponding to the electrodes 12_*n*1 and 12_*n*3, for example, may possibly be affected by the parasitic capacitance Cpara and the quantization error. As a result, the accuracy of detecting the object to be detected F may possibly be reduced.

Figure 8:
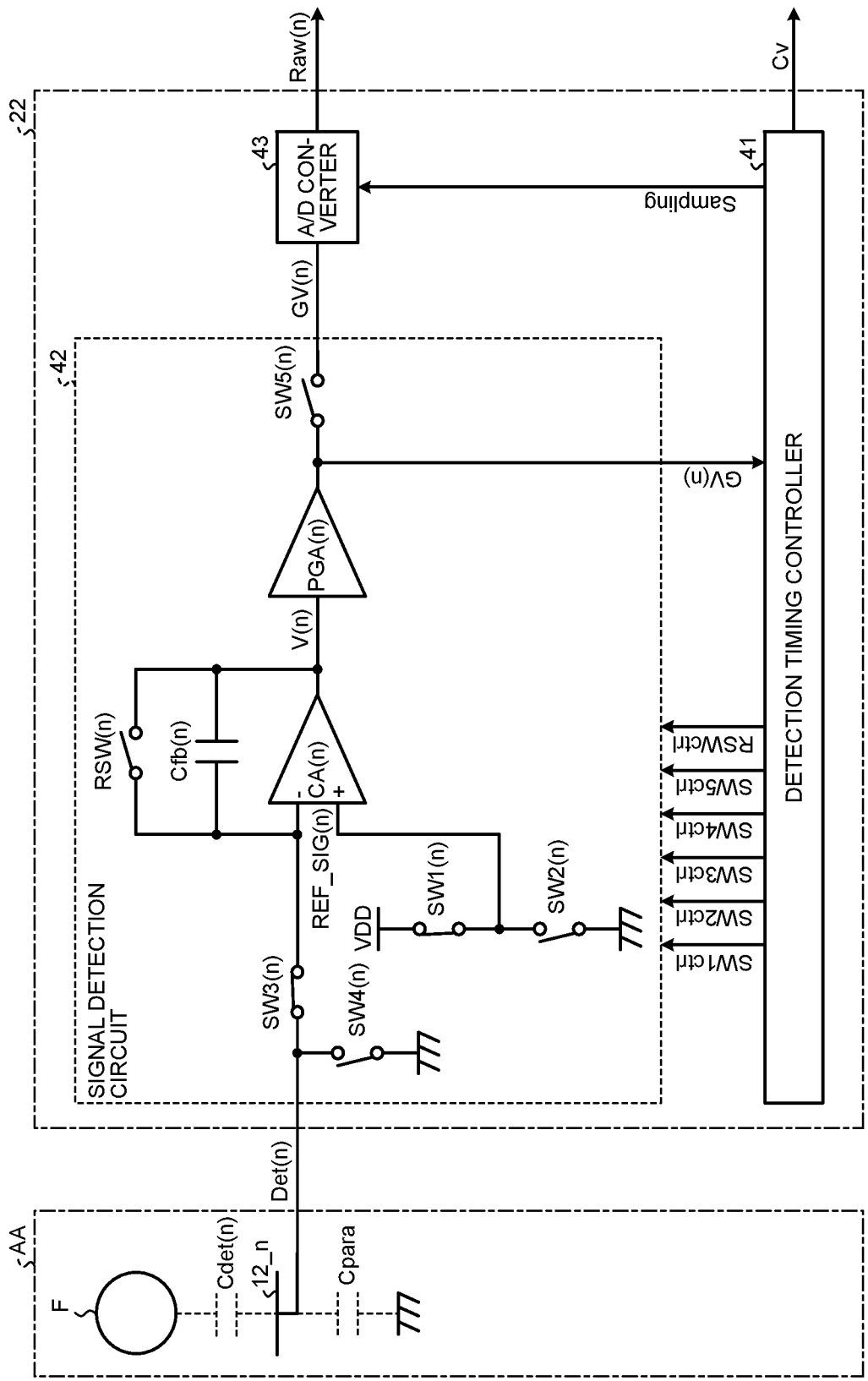
FIG. 8 is a diagram of an example of a specific circuit configuration of the AFE circuit according to the embodiment.

The following describes the configuration and operation according to the embodiment that can expand the range in which the object to be detected F on the detection region AA can be detected with high accuracy. FIG. 8 is a diagram of an example of a specific circuit configuration of the AFE circuit according to the embodiment. The following describes points different from those according to the comparative example described above in greater detail, and the same explanation as that in the comparative example may be omitted.

In the signal detection circuit 42 according to the embodiment, the inverting input terminal of the differential amplification circuit CA(n) is coupled to the electrode 12_*n* provided in the detection region AA via a third switch circuit SW3. The electrode 12_*n* is coupled to the second reference potential GND via a fourth switch circuit SW4. The third switch circuit SW3 is turned on and off by a third switch control signal SW3ctrl output from the detection timing control circuit 41. The fourth switch circuit SW4 is turned on and off by a fourth switch control signal SW4ctrl output from the detection timing control circuit 41.

Specifically, when the third switch circuit SW3 is turned on, and the fourth switch circuit SW4 is turned off, the electrode 12_*n* is coupled to the inverting input terminal of the differential amplification circuit CA(n). When the third switch circuit SW3 is turned off, and the fourth switch circuit SW4 is turned on, the inverting input terminal of the differential amplification circuit CA(n) is decoupled from the electrode 12_*n*, and the electric charge with which the electrode 12_*n* is charged is reset. By turning on and off the third switch circuit SW3 and the fourth switch circuit SW4, the electrode 12_*n* is charged and discharged.

The amplification circuit PGA(n) amplifies an output value V(n) of the differential amplification circuit CA(n). When the gain of the amplification circuit PGA(n) is G, the output value of the signal detection circuit 42 can be expressed as GV(n) by multiplying the output value V(n) of the differential amplification circuit CA(n) by the gain G.

The output value GV(n) of the signal detection circuit 42 according to the present embodiment is output to the A/D conversion circuit 43 via a fifth switch circuit SW5. The fifth switch circuit SW5 is turned on and off by a fifth switch control signal SW5ctrl output from the detection timing control circuit 41. The fifth switch control signal SW5ctrl is turned on in synchronization with the sampling timing of the A/D conversion circuit 43.

The output value GV(n) of the amplification circuit PGA(n) according to the present embodiment is output to the detection timing control circuit 41.

The detection timing control circuit 41 calculates an integrated value Vint(n) by applying the following Expressions (3) and (4) to the output values GV(n)_odd and GV(n)_even, respectively, of the signal detection circuit 42.

$$\text{Vint}(n) = GV(n)\_\text{odd} \quad (3)$$

$$\text{Vint}(n) = GVDD - GV(n)\_\text{even} \quad (4)$$

The detection timing control circuit 41 according to the present embodiment has an integration threshold Vintth for the integrated value Vint(n). The detection timing control circuit 41 performs a comparison arithmetic operation between the integrated value Vint(n) and the integration threshold Vintth to control the sampling timing of the A/D conversion circuit 43. Specifically, the A/D conversion circuit 43 performs sampling on the output value GV(n) of the signal detection circuit 42 when the integrated value Vint(n) is equal to or larger than the integration threshold Vintth (Vint(n)≥Vintth). The integration threshold Vintth is preferably set to a value smaller than the value corresponding to the upper limit gradation S_upper_lim of the signal value S_odd (or the signal value S_even) illustrated in FIG. 7.

Figure 9:
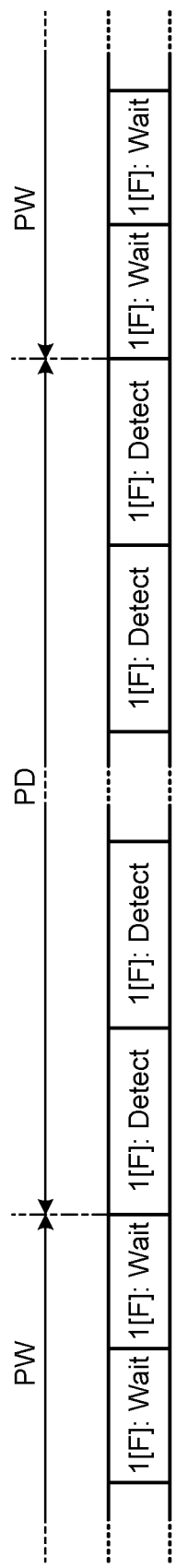
FIG. 9 is a conceptual diagram of an example of a detection period of the detecting device according to the embodiment.
Figure 10:
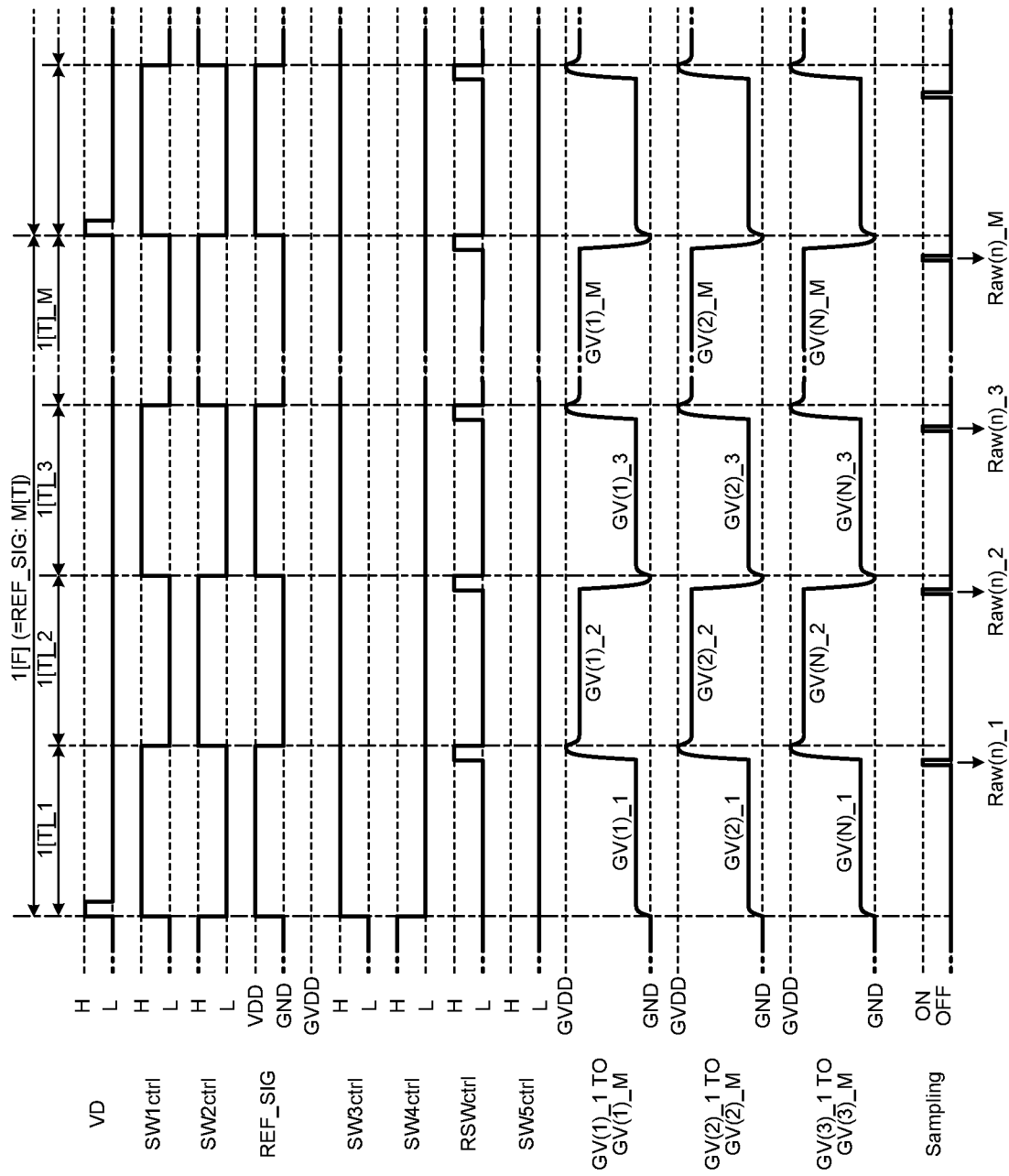
FIG. 10 is a timing chart of an example of operation in a first period of the detecting device according to the embodiment.
Figure 11:
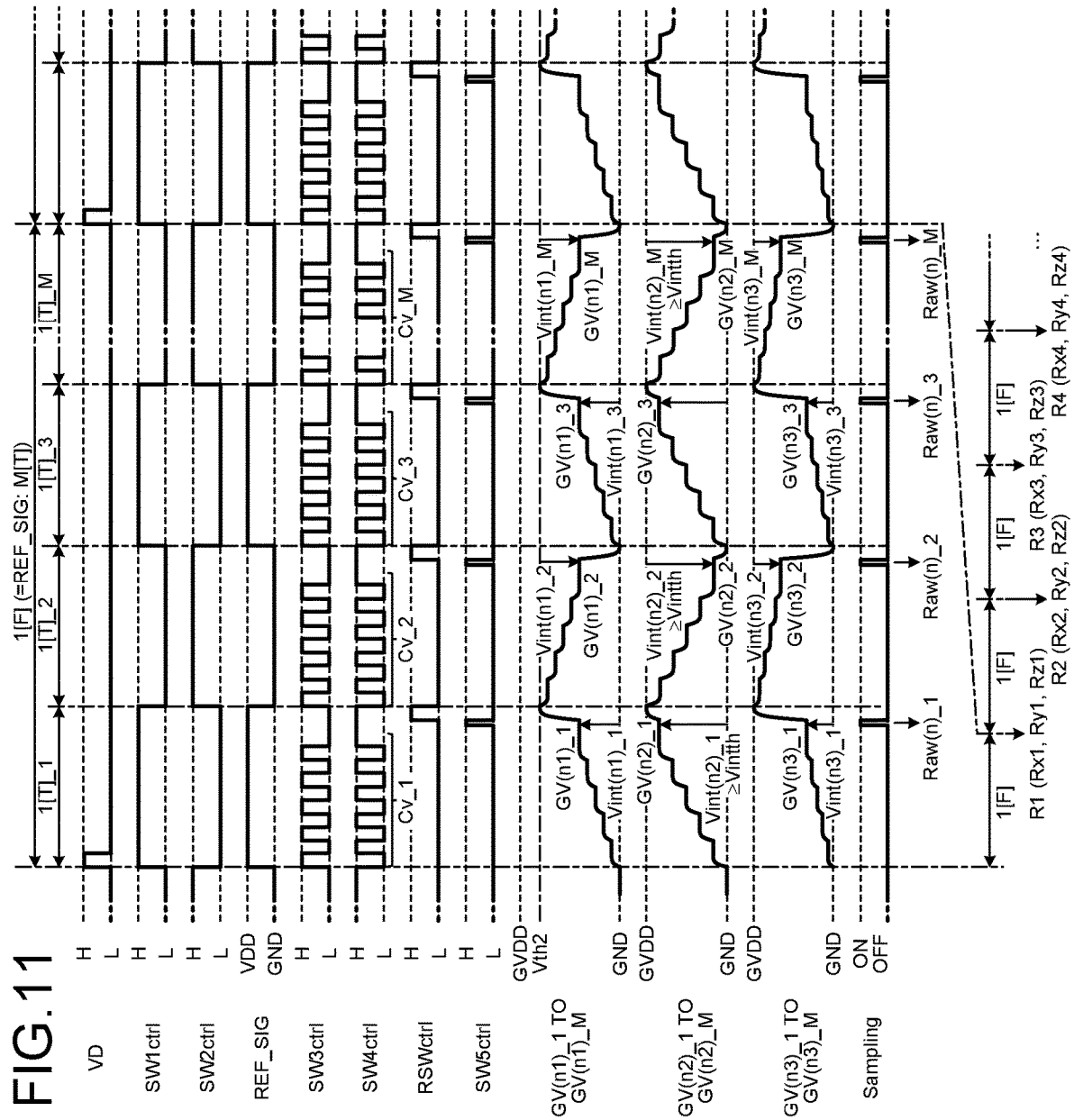
FIG. 11 is a timing chart of an example of operation in a second period of the detecting device according to the embodiment.
Figure 12:
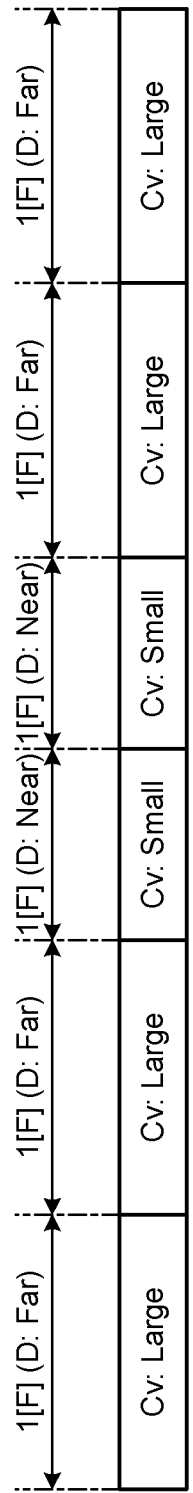
FIG. 12 is a conceptual diagram of an example of the second period of the detecting device according to the embodiment.

The following describes the operation in the configuration according to the embodiment illustrated in FIG. 8 with reference to FIGS. 9 to 12. FIG. 9 is a conceptual diagram of an example of a detection period of the detecting device according to the embodiment. FIG. 10 is a timing chart of an example of the operation in a first period of the detecting device according to the embodiment. FIG. 11 is a timing chart of an example of the operation in a second period of the detecting device according to the embodiment. FIG. 12 is a conceptual diagram of an example of the second period of the detecting device according to the embodiment.

As illustrated in FIG. 9, the detecting device 1 according to the present embodiment has a first period PW and a second period PD. The first period PW is a period for detecting whether the object to be detected F is present in the space on the detection surface. The second period PD is a period for detecting the position of the object to be detected F in the space on the detection surface. The detecting device 1 according to the present embodiment detects the object to be detected F in the space on the detection surface in the first period PW and then shifts to the second period PD. The detecting device 1 according to the present embodiment shifts to the first period PW when it fails to detect the position of the object to be detected F in the space on the detection surface in the second period PD.

Similarly to the comparative example illustrated in FIG. 5, FIGS. 10 and 11 illustrate an example of detecting the object to be detected F by defining M sampling periods (M is a natural number equal to or larger than 1) as one frame (1[F]=M[T]).

Also in the configuration according to the embodiment illustrated in FIG. 8, the negative feedback capacitor Cfb of the differential amplification circuit CA(n) is reset in the sampling period 1[T]_m (m is a natural number of 1 to M) similarly to the comparative example illustrated in FIG. 5.

Specifically, in the operation in the first period PW illustrated in FIG. 10, the detecting device 1 according to the present embodiment turns on the third switch circuit SW3 and turns off the fourth switch circuit SW4.

FIG. 10 illustrates the output values GV(n1)_1 to GV(n1)_M of the signal detection circuit 42 at the electrode 12_*n*1, the output values GV(n2)_1 to GV(n2)_M of the signal detection circuit 42 at the electrode 12_*n*2, and the output values GV(n3)_1 to GV(n3)_M of the signal detection circuit 42 at the electrode 12_*n*3.

In the example of the operation in the first period PW illustrated in FIG. 10, the output values GV(n1)_1 to GV(n1)_M of the signal detection circuit 42 at the electrode 12_n1, the output values GV(n2)_1 to GV(n2)_M of the signal detection circuit 42 at the electrode 12_n2, and the output values GV(n3)_1 to GV(n3)_M of the signal detection circuit 42 at the electrode 12_n3 indicate the state where the parasitic capacitance Cpara has a large effect on the capacitance Cdet(n) generated at each electrode 12. In other words, in the first period PW, the object to be detected F is not present in the space on the detection region AA or is present at a position relatively far in the space on the detection region AA. In this first period PW, the detecting device 1 acquires the signal value S(n) of each electrode 12 at a predetermined frame rate as illustrated in FIG. 9.

In the example of the operation in the first period PW, the detecting device 1 according to the present embodiment charges each electrode 12 with an electric charge corresponding to the distance D between the object to be detected F and the electrode 12. At this time, the "−" terminal (inverting input terminal) of the differential amplification circuit CA(n) receives the detection signal Det(n) corresponding to the electric charge with which each electrode 12 is charged. Accordingly, the negative feedback capacitor Cfb of the differential amplification circuit CA(n) is charged.

The signal processing circuit 44 calculates a sum Ssum of the signal values S(n) of each electrode 12 calculated using Expressions (1), (2), and (3).

The signal processing circuit 44 according to the present embodiment has a sum threshold Ssumth for the sum Ssum. The signal processing circuit 44 performs a comparison arithmetic operation between the sum Ssum and the sum threshold Ssumth in the first period PW. When Ssum Ssumth is satisfied in the comparison arithmetic operation in the signal processing circuit 44, the detecting device 1 shifts to the second period PD. The sum threshold Ssumth is preferably set to a value larger than the lower limit gradation S_lower_lim of the signal value S_odd (or the signal value S_even) illustrated in FIG. 7.

In the example of the operation in the second period PD illustrated in FIG. 11, the detecting device 1 according to the present embodiment turns on the third switch circuit SW3 and turns off the fourth switch circuit SW4 in the "H" period and the "L" period of the reference signal REF_SIG after resetting the negative feedback capacitor Cfb of the differential amplification circuit CA(n). As a result, each electrode 12 is charged with an electric charge corresponding to the distance D between the object to be detected F and the electrode 12. At this time, the "−" terminal (inverting input terminal) of the differential amplification circuit CA(n) receives the detection signal Det(n) corresponding to the electric charge with which each electrode 12 is charged. Accordingly, the negative feedback capacitor Cfb of the differential amplification circuit CA(n) is charged.

Subsequently, the detecting device 1 turns off the third switch circuit SW3 and turns on the fourth switch circuit SW4, thereby resetting the electric charge with which each electrode 12 is charged while maintaining the electric charge of the negative feedback capacitor Cfb. After that, the detecting device 1 turns on the third switch circuit SW3 and turns off the fourth switch circuit SW4 again, thereby charging each electrode 12 with an electric charge corresponding to the distance D between the object to be detected F and the electrode 12. The "−" terminal (inverting input terminal) of the differential amplification circuit CA(n) receives the detection signal Det(n) corresponding to the electric charge with which each electrode 12 is charged. Accordingly, the negative feedback capacitor Cfb of the differential amplification circuit CA(n) is charged.

In the example of the operation in the second period PD illustrated in FIG. 11, the charging and discharging operations described above are repeated in one sampling period, thereby accumulating the electric charge with which the negative feedback capacitor Cfb of the differential amplification circuit CA(n) is charged.

FIG. 11 illustrates the output values GV(n1)_1 to GV(n1)_M of the signal detection circuit 42 at the electrode 12_n1, the output values GV(n2)_1 to GV(n2)_M of the signal detection circuit 42 at the electrode 12_n2, and the output values GV(n3)_1 to GV(n3)_M of the signal detection circuit 42 at the electrode 12_n3. In FIG. 11, when the distance of the electrode 12_n1 from the object to be detected F is D(n1), the distance of the electrode 12_n2 from the object to be detected F is D(n2), and the distance of the electrode 12_n3 from the object to be detected F is D(n3), D(n2)<D(n1)<D(n3) is satisfied similarly to the comparative example illustrated in FIG. 5.

In the example of the operation in the second period PD illustrated in FIG. 11, the detection timing control circuit 41 performs a comparison arithmetic operation between all the integrated values Vint(n) of the signal detection circuit 42 and the integration threshold Vintth. When one of the integrated values Vint(n) corresponding to the respective electrodes 12 satisfies Vint(n)≥Vintth, the detection timing control circuit 41 stops the on/off control on the third switch circuit SW3 and the fourth switch circuit SW4. The detection timing control circuit 41 controls the sampling timing of the A/D conversion circuit 43 and turns on the fifth switch circuit SW5 in synchronization with the sampling timing. As a result, the output value GV(n) of the signal detection circuit 42 is output to the A/D conversion circuit 43. FIG. 11 illustrates an example where Vint(n)≥Vintth is satisfied in the output values GV(n2)_1 to GV(n2)_M of the signal detection circuit 42 at the electrode 12_n2.

The detection timing control circuit 41 according to the present embodiment also has a function of counting and resetting the number of times of the on/off control on the third switch circuit SW3 and the fourth switch circuit SW4 in the "H" period and the "L" period of the reference signal REF_SIG, in other words, the number of times of charging and discharging (count value) CV of the electrode 12. The detection timing control circuit 41 starts counting the number of times of charging and discharging (count value) CV of the electrode 12 in synchronization with the on/off control on the first switch circuit SW1 and the second switch circuit SW2 and resets the number of times of charging and discharging (count value) CV of the electrode 12 when the negative feedback capacitor Cfb is reset. In other words, the detection timing control circuit 41 resets the number of times of charging and discharging (count value) CV of the electrode 12 and starts counting in each sampling period.

The detection timing control circuit 41 according to the present embodiment has a count threshold Cvth for the number of times of charging and discharging (count value) Cv of the electrode 12. Specifically, the count threshold Cvth is preferably set to a value at which the object to be detected F can be considered not to be present in the space on the detection region AA.

In the example of the operation in the second period PD illustrated in FIG. 11, the detection timing control circuit 41 performs a comparison arithmetic operation between the number of times of charging and discharging (count value) Cv of the electrode 12 and the count threshold Cvth. When the number of times of charging and discharging (count value) Cv of the electrode 12 is equal to or larger than the count threshold Cvth (Cv≥Cvth), the detecting device 1 shifts to the first period PW.

The length of one sampling period 1[T]_m in the second period PD of the detecting device 1 according to the present embodiment is determined based on the results of the comparison arithmetic operation between all the integrated values Vint(n) of the signal detection circuit 42 and the integration threshold Vintth. Specifically, the sampling is performed when one of the integrated values Vint(n) corresponding to the respective electrodes 12 satisfies Vint(n)≥Vintth. In other words, in the second period PD, the detecting device 1 determines the sampling timing for acquiring the signal value S(n) of each electrode 12 based on the result of the comparison arithmetic operation between the integrated value Vint(n) and the integration threshold Vintth.

More specifically, the number of times of charging and discharging (count value) Cv of the electrode 12 increases, and the length of one sampling period 1[T]_m in the second period PD increases as the distance D between the object to be detected F and the electrode 12 is relatively larger. The number of times of charging and discharging (count value) Cv of the electrode 12 decreases, and the length of one sampling period 1[T]_m in the second period PD decreases as the distance D between the object to be detected F and the electrode 12 is relatively smaller. Therefore, the length of one frame period is longer as the position of the object to be detected F on the detection region AA is farther from the detection surface and is shorter as the position of the object to be detected F on the detection region AA is closer to the detection surface as illustrated in FIG. 12.

Thus, in the second period PD of the detecting device 1 according to the present embodiment, the detecting device 1 acquires the signal value S(n) of each electrode 12 at the sampling timing determined based on the results of the comparison arithmetic operation between all the integrated values Vint(n) of the signal detection circuit 42 and the integration threshold Vintth. As a result, the length of one frame period in the second period PD differs depending on the relative distance D between the sensor region 10 and the object to be detected F as illustrated in FIG. 12, unlike the first period PW in which the signal value S(n) of each electrode 12 is acquired at a predetermined frame rate.

In the present embodiment, the integrated value Vint(n) satisfying Vint(n)≥Vintth is equal to or larger than the integration threshold Vintth regardless of the magnitude of the distance D(n) of the electrode 12 from the object to be detected F. The coordinate extraction circuit 45 at the latter stage according to the present embodiment performs weighting on the signal value S(n) of each electrode 12 output from the signal processing circuit 44 based on the number of times of charging and discharging (count value) Cv of the electrodes 12 and performs spatial coordinate extraction on the position where the object to be detected F is present. As a result, the positional information in the Dz direction of the object to be detected F on the detection surface is complemented.

In the example of the operation in the second period PD illustrated in FIG. 11, the number of times of charging and discharging (count value) Cv of the electrode 12 may be output in each frame or each sampling period 1[T]_m. To output the number of times of charging and discharging (count value) Cv of the electrode 12 in each frame, the number of times of charging and discharging (count value) Cv obtained in one sampling period 1[T]_m may be averaged and output, or the number of times of charging/discharging (count value) Cv output from the detection timing control circuit 41 in one sampling period 1[T]_m may be averaged by the coordinate extraction circuit 45.

In the second period PD of the detecting device 1 according to the present embodiment, an electric charge may possibly be accumulated in the negative feedback capacitor Cfb of the differential amplification circuit CA(n) by the parasitic capacitance Cpara generated between each electrode 12 and the shield potential (e.g., GND potential) when the object to be detected F is not present in the space on the detection region AA. As a result, the integrated value Vint(n) may possibly be equal to or larger than the integration threshold Vintth (Vint(n)≥Vintth).

As described above, the detecting device 1 according to the present embodiment performs a comparison arithmetic operation between the sum Ssum of the signal values S(n) of each electrode 12 and the sum threshold Ssumth in the first period PW. When the sum Ssum of the signal values S(n) of each electrode 12 is equal to or larger than the sum threshold Ssumth (Ssum≥Ssumth), the detecting device 1 shifts to the second period PD.

As described above, the detecting device 1 according to the present embodiment performs a comparison arithmetic operation between the number of times of charging and discharging (count value) Cv of the electrode 12 and the count threshold Cvth in the second period PD. When the number of times of charging and discharging (count value) Cv of the electrode 12 satisfies Cv≥Cvth, the detecting device 1 shifts to the first period PW.

This configuration can prevent an electric charge from being accumulated in the negative feedback capacitor Cfb of the differential amplification circuit CA(n) by the parasitic capacitance Cpara generated between each electrode 12 and the shield potential (e.g., GND potential) in the second period PD. Therefore, the present embodiment can prevent the object to be detected F from being erroneously detected when the object to be detected F is not actually present in the space on the detection region AA.

Figure 13:
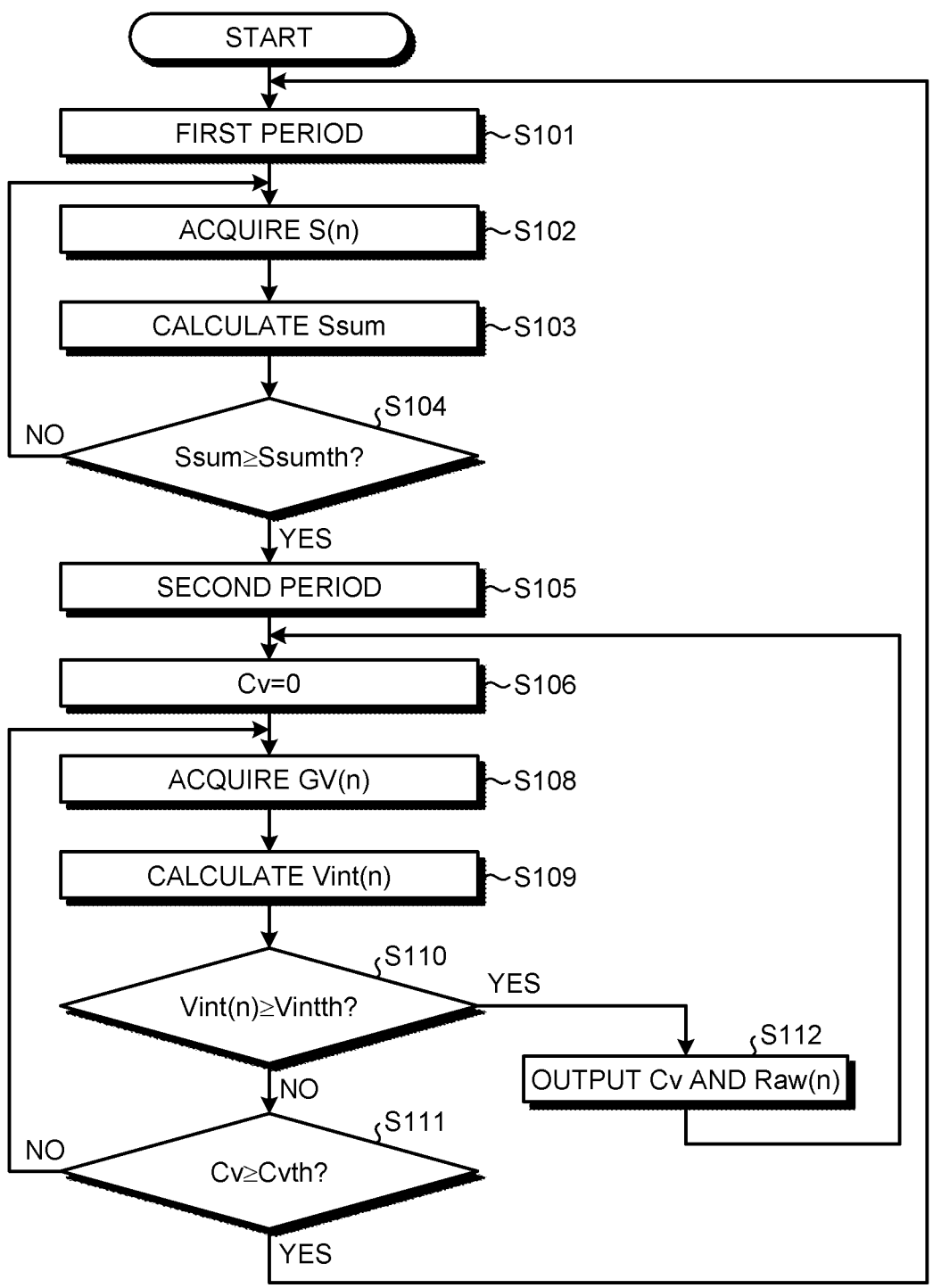
FIG. 13 is a flowchart of an example of processing performed by the detecting device according to the embodiment.

The following describes the processing performed by the detecting device according to the embodiment with reference to FIG. 13. FIG. 13 is a flowchart of an example of the processing performed by the detecting device according to the embodiment.

When the detecting device 1 starts the detection operation in the first period PW (Step S101), the signal processing circuit 44 acquires the signal value S(n) of each electrode 12 (Step S102) and calculates the sum Ssum of the signal values S(n) of each electrode 12 (Step S103).

Subsequently, the signal processing circuit 44 performs a comparison arithmetic operation between the sum Ssum calculated at Step S103 and the sum threshold Ssumth (Step S104).

If the sum Ssum of the signal values S(n) of each electrode 12 is smaller than the sum threshold Ssumth (Ssum<Ssumth, No at Step S104), the signal processing circuit 44 repeatedly performs the processing from Step S102 to Step S104.

If the signal value S(n) of each electrode 12 is equal to or larger than the sum threshold Ssumth (Ssum≥Ssumth, Yes at Step S104), the detecting device 1 shifts from the first period PW to the second period PD (Step S105).

When the detecting device 1 shifts to the second period PD (Step S105), the detection timing control circuit 41 resets the number of times of charging and discharging (count value) Cv of the electrode 12 (Cv=0) (Step S106).

The detection timing control circuit 41 acquires the output value GV(n) of the signal detection circuit 42 (Step S108) and calculates the integrated value Vint(n) of each electrode 12 (Step S109).

Subsequently, the detection timing control circuit 41 performs a comparison arithmetic operation between the integrated value Vint(n) of each electrode 12 calculated at Step S109 and the integration threshold Vintth (Step S110).

If the integrated values Vint(n) of all the electrodes 12 are smaller than the integration threshold Vintth (Vint(n) <Vintth) (No at Step S110), the detection timing control circuit 41 performs a comparison arithmetic operation between the number of times of charging and discharging (count value) Cv of the electrode 12 and the count threshold Cvth (Step S111).

If the number of times of charging and discharging (count value) Cv of the electrode 12 is smaller than the count threshold Cvth (Cv<Cvth, No at Step S111), the detection timing control circuit 41 performs the processing at Step S108 again and repeatedly performs the processing described above until one of the integrated values Vint(n) of the respective electrodes 12 is equal to or larger than the integration threshold Vintth (Vint(n)≥Vintth) (Yes at Step S110) or until the number of times of charging and discharging (count value) Cv of the electrode 12 is equal to or larger than the count threshold Cvth (Cv≥Cvth, Yes at Step S111).

If one of the integrated values Vint(n) of the respective electrodes 12 is equal to or larger than the integration threshold Vintth (Vint(n)≥Vintth) (Yes at Step S110), the detection timing control circuit 41 of the AFE circuit 22 controls the sampling timing of the A/D conversion circuit 43, and the A/D conversion circuit 43 performs sampling on the output value GV(n) of the signal detection circuit 42 and acquires the detected value Raw(n). The AFE circuit 22 outputs the number of times of charging and discharging (count value) Cv of the electrode 12 at that time and the detected value Raw(n) acquired by the A/D conversion circuit 43 to the processing circuit 23 at the latter stage (Step S112). Subsequently, the detection timing control circuit 41 performs the processing at Step S106 again and repeatedly performs the processing described above until one of the integrated values Vint(n) of the respective electrodes 12 is equal to or larger than the integration threshold Vintth (Vint(n)≥Vintth) (Yes at Step S110) or until the number of times of charging and discharging (count value) Cv of the electrode 12 is equal to or larger than the count threshold Cvth (Cv≥Cvth, Yes at Step S111).

If the number of times of charging and discharging (count value) Cv of the electrode 12 is equal to or larger than the count threshold Cvth (Cv≥Cvth, Yes at Step S111), the detecting device 1 performs the processing at Step S101 again. As a result, the detecting device 1 shifts from the first period PW to the second period PD (Step S101).

Figure 14:
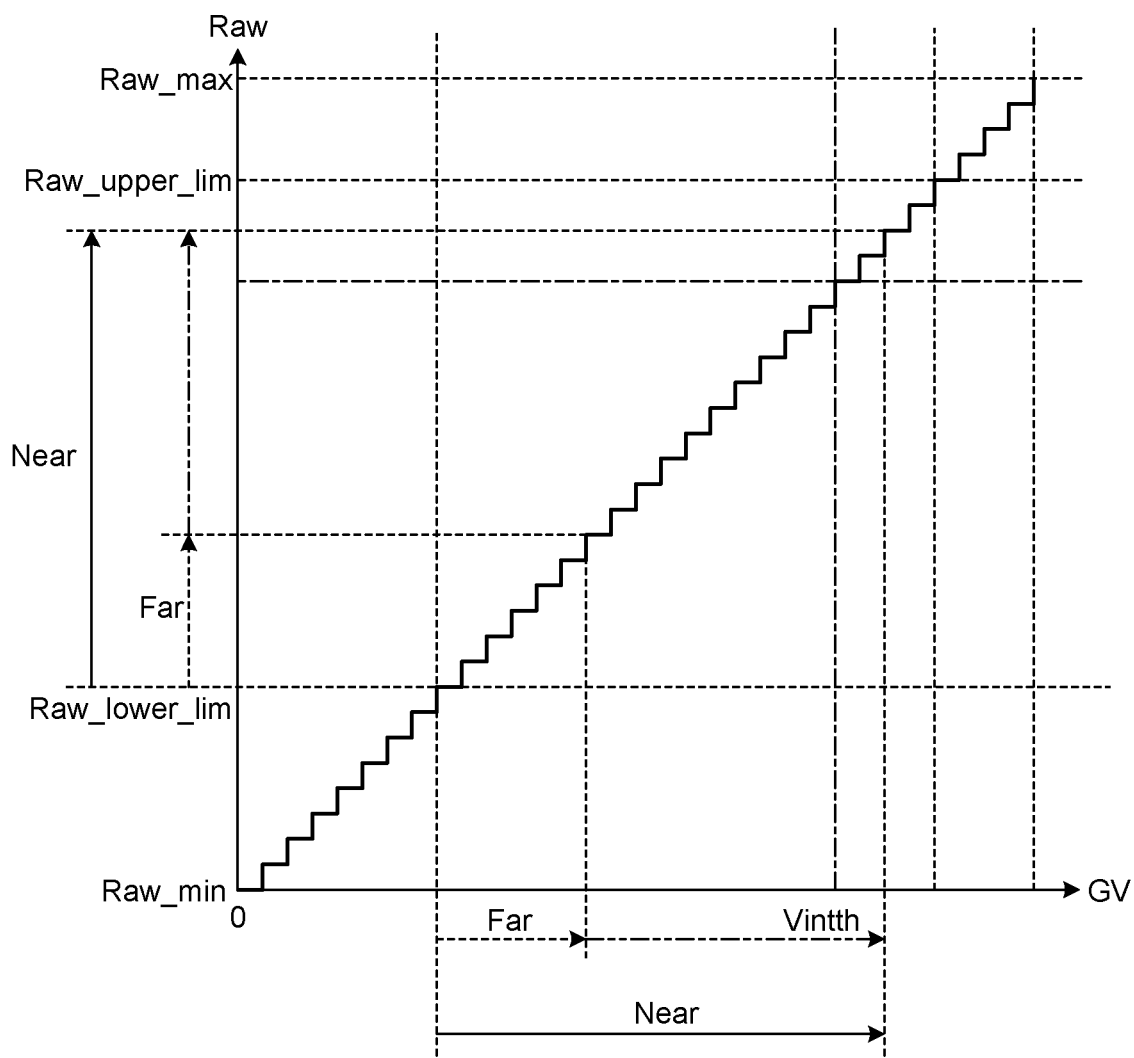
FIG. 14 is a diagram of an example of input/output characteristics of an A/D conversion circuit.

FIG. 14 is a diagram of an example of input/output characteristics of the A/D conversion circuit. In FIG. 14, the horizontal axis indicates the output value GV of the signal detection circuit 42 input to the A/D conversion circuit 43, and the vertical axis indicates the detected value Raw corresponding to the output value GV of the signal detection circuit 42.

When the number of gradations of the detected value Raw that can be output from the A/D conversion circuit 43 is $2^n$, the minimum gradation Raw min is "0", and the maximum gradation Raw max is "$2^n-1$". Specifically, when the resolution of the A/D conversion circuit 43 is 12 bits (n=12), for example, the minimum gradation Raw min is "0", and the maximum gradation Raw max is "4095". FIG. 14 illustrates an example where the resolution of the A/D conversion circuit 43 is 5 bits (n=5). In this case, the minimum gradation Raw min is "0", and the maximum gradation Raw max is "31".

In FIG. 14, the lower limit gradation considering the effect of quantization error is Raw_lower_lim, and the upper limit gradation considering the overflow margin is Raw_upper_lim.

In the configuration and operation according to the comparative example described above (FIGS. 5 and 6), the range represented by the solid arrow in FIG. 14 indicates the acquisition range of the output value GV and the detected value Raw when the object to be detected F is present at a position relatively close to the sensor region 10. The range represented by the dashed arrow in FIG. 14 indicates the detection range of the output value GV and the detected value Raw when the object to be detected F is present at a position relatively far from the sensor region 10.

In the configuration and operation according to the comparative example described above (FIGS. 5 and 6), the range of the detected value Raw used to detect the position of the object to be detected F is from the lower limit gradation Raw_lower_lim to the output value GV and the detected value Raw of the electrode 12 present at the position closest to the object to be detected F. In other words, the range of the detected value Raw when the object to be detected F is present at a position relatively far from the sensor region 10 (dashed line) is relatively narrower than the range of the detected value Raw when the object to be detected F is present at a position relatively close to the sensor region 10 (solid line).

By contrast, in the configuration and operation according to the present disclosure, a comparison arithmetic operation between all the integrated values Vint(n) of the signal detection circuit 42 and the integration threshold Vintth is performed. When one of the integrated values Vint(n) corresponding to the respective electrodes 12 is equal to or larger than the integration threshold Vintth (Vint(n)≥Vintth), the output value GV of each electrode 12 is acquired and converted into the detected value Raw. Therefore, the present embodiment can expand the range of the output value GV and the detected value Raw of each electrode 12 when the object to be detected F is present at a position relatively far from the sensor region 10 as indicated by the alternate long and two short dashes line in FIG. 14.

In the detecting device 1 according to the present embodiment, the integrated value Vint(n) of the electrode 12 closest to the object to be detected F out of the electrodes 12 in the detection region AA is equal to or larger than the integration threshold Vintth by the processing described above. As a result, the integrated value Vint(n) of the electrode 12 relatively far from the object to be detected F is also a large value, and the gradation range of the signal value S(n) acquired at each electrode 12 is relatively large. Therefore, the present embodiment can expand the range in which the object to be detected F on the detection region AA can be detected with high accuracy.

The detecting device 1 according to the present embodiment performs weighting on the signal value S(n) of each electrode 12 based on the number of times of charging and discharging (count value) Cv of the electrodes 12 and performs spatial coordinate extraction on the position where the object to be detected F is present. As a result, the positional information in the Dz direction of the object to be detected F on the detection surface is complemented.

In addition, the detecting device 1 according to the present embodiment sets the first period PW for determining whether the object to be detected F is present in the space on the detection region AA and the second period PD for detecting the position of the object to be detected F. If the integrated value Vint(n) of none of the electrodes 12 in the detection region AA is equal to or larger than the integration threshold Vintth, and the number of times of charging and discharging (count value) Cv of the electrode 12 is equal to or larger than the count threshold Cvth in the second period PD, the detecting device 1 shifts from the second period PD to the first period PW. Therefore, the present embodiment can prevent the object to be detected F from being erroneously detected when the object to be detected F is not present in the space on the detection region AA.

While an exemplary embodiment according to the present disclosure has been described, the embodiment is not intended to limit the present disclosure. The contents disclosed in the embodiment are given by way of example only, and various modifications may be made without departing from the spirit of the present disclosure. Appropriate modifications made without departing from the spirit of the present disclosure naturally fall within the technical scope of the present disclosure.

What is claimed is:

1. A detecting device comprising:
a sensor region having a detection region;
a plurality of electrodes provided to the detection region; and
a detection circuit configured to detect an object to be detected on the detection region frame by frame based on a detected value of each of the electrodes, wherein
length of one frame period for detecting the object to be detected on the detection region differs depending on a relative distance between the sensor region and the object to be detected.

2. The detecting device according to claim 1, wherein the detection circuit integrates the detected value of each of the electrodes at predetermined intervals for each of the electrodes and detects a position of the object to be detected in a space on the detection region based on number of integrations until an integrated value of one of the electrodes is equal to or larger than a predetermined value.

3. The detecting device according to claim 2, wherein
the detection circuit comprises a plurality of differential amplification circuits to which the respective electrodes are electrically coupled, and
an electric charge corresponding to number of times of charging and discharging the electrode is accumulated in a negative feedback capacitor of the differential amplification circuit.

4. The detecting device according to claim 1, wherein the detection circuit has: a first period for detecting whether the object to be detected is present on the detection region based on a sum of the detected value for each of the electrodes, and
a second period for integrating the detected value of each of the electrodes at predetermined intervals for each of the electrodes and detecting a position of the object to be detected in a space on the detection region based on number of integrations until an integrated value of one of the electrodes is equal to or larger than a predetermined value.

5. The detecting device according to claim 4, wherein
the detection circuit comprises a plurality of differential amplification circuits to which the respective electrodes are electrically coupled, and
an electric charge corresponding to number of times of charging and discharging the electrode is accumulated in a negative feedback capacitor of the differential amplification circuit in the second period.

6. The detecting device according to claim 5, wherein
the detection circuit shifts to the second period when the sum of the detected value of each of the electrodes is equal to or larger than a predetermined value in the first period, and
the detection circuit shifts to the first period when the number of times of charging and discharging is equal to or larger than a predetermined value in the second period.

7. The detecting device according to claim 1, wherein
the electrodes are arrayed in a first direction and a second direction different from the first direction in the detection region, the electrode has a side extending in the first direction with a length of 20 [mm] to 50 [mm], and
the electrode has a side extending in the second direction with a length of 20 [mm] to 50 [mm].

* * * * *